United States Patent
Adachi et al.

[19]

[11] Patent Number: 6,042,667
[45] Date of Patent: *Mar. 28, 2000

[54] METHOD OF FABRICATING CERAMIC MULTILAYER SUBSTRATE

[75] Inventors: Satoru Adachi; Junzo Fukuta, both of Nagoya; Katsuya Kawakami, Toyoake; Seigo Ooiwa, Nagoya, all of Japan

[73] Assignee: Sumotomo Metal Electronics Devices, Inc., Mine, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/810,089

[22] Filed: Mar. 3, 1997

[30] Foreign Application Priority Data

Mar. 13, 1996 [JP] Japan ..................... 8-055645
Mar. 13, 1996 [JP] Japan ..................... 8-055646

[51] Int. Cl.⁷ .................................. B32B 31/20
[52] U.S. Cl. ..................... 156/89.12; 156/89.16; 156/289; 156/312; 29/851
[58] Field of Search ............... 156/89.12, 89.16, 156/89.17, 89.18, 289, 312; 264/619; 29/851

[56] References Cited

U.S. PATENT DOCUMENTS

| | | |
|---|---|---|
| 4,340,436 | 7/1982 | Dubetsky et al. . |
| 4,753,694 | 6/1988 | Herron et al. . |
| 4,879,156 | 11/1989 | Herron et al. .......................... 428/137 |
| 4,920,640 | 5/1990 | Enloe et al. . |
| 4,929,295 | 5/1990 | Kohno et al. ............................ 156/230 |
| 5,085,720 | 2/1992 | Mikeska et al. . |
| 5,130,067 | 7/1992 | Flaitz et al. . |
| 5,254,191 | 10/1993 | Mikeska et al. . |
| 5,277,723 | 1/1994 | Kodama et al. . |
| 5,370,759 | 12/1994 | Hakotani et al. . |
| 5,387,474 | 2/1995 | Mikeska et al. . |
| 5,456,778 | 10/1995 | Fukuta et al. . |
| 5,470,412 | 11/1995 | Fukuta et al. . |
| 5,474,741 | 12/1995 | Mikeska et al. . |
| 5,814,366 | 9/1998 | Fukuta et al. ..................... 156/89.11 X |

FOREIGN PATENT DOCUMENTS

| | | |
|---|---|---|
| 0 300 186 | 1/1989 | European Pat. Off. . |
| 3900 160 | 7/1989 | Germany . |
| 42 04 867 | 11/1992 | Germany . |
| WO91/10630 | 7/1991 | WIPO . |

OTHER PUBLICATIONS

Neuhauser et al., Fugen von Technischen Keramiken mit Keramik–Grufolien, (1995), pp 17–20.

*Primary Examiner*—Curtis Mayes
*Attorney, Agent, or Firm*—Foley & Lardner

[57] ABSTRACT

A method of fabricating a ceramic multilayer substrate includes steps of laminating a plurality of green sheets including an inside green sheet formed with a conductor pattern and pressing a laminate of green sheets under a predetermined pressure together with sheet restricting members applied to opposite surfaces of the laminate respectively, thereby bonding the laminate and sheet restricting members together, each sheet restricting member having a smaller percent change in thickness than the green sheets during the bonding and a higher firing temperature than the green sheets, firing a bonded assemblage of the green sheets and sheet restricting members at a firing temperature of the green sheets, and removing the sheet restricting members from the opposite surfaces of a fired body.

13 Claims, 3 Drawing Sheets

METHOD OF FABRICATING CERAMIC MULTILAYER SUBSTRATE

BACKGROUND OF THE INVENTION

1. Field of the Invention

This invention relates to a method of fabricating ceramic multilayer substrates by laminating green sheets.

2. Description of the Prior Art

Reduction in planar or X-Y shrinkage of ceramic substrates during firing has recently been desired for improvement in dimensional accuracy of the substrates. PCT WO91/10630 discloses a method of fabricating ceramic substrates in which a green sheet to be formed into an insulating layer of a ceramic substrate is provided with two release green sheets stacked on upper and lower surfaces thereof respectively. Each release green sheet is unsintered at a firing temperature of the green sheet. The green sheet is fired with the stacked assemblage under pressure. Thereafter, the unsintered release green sheets adherent to both surfaces of the fired assemblage are removed, so that the ceramic substrate is obtained.

The ceramic substrate is often fabricated into a multilayer structure by laminating a plurality of green sheets. The ceramic multilayer substrate has conductor patterns formed on inside layers thereof. The surfaces of the substrate are deformed such that portions thereof corresponding to the conductor pattern 14 are outwardly convexed when, as shown in FIG. 4, a pressure is applied to a laminate of green sheets 11 with two release green sheets 12 placed on opposite surfaces of the laminate so that the laminate and the release green sheets 12 are bonded together, or when, as shown in FIG. 5, a bonded laminate of green sheets 11 is fired together with the release green sheets 12 placed on the opposite surfaces of the laminate while a pressure is being applied to the laminate by a pressing machine 13. As a result, surface flatness or planarity of the substrate is disadvantageously reduced. The reduction in the substrate surface flatness lowers the reliability of conductor patterns which are printed on the surfaces of the substrate and fired after firing of the substrate, or causes reduction in the reliability in connection of an IC chip to be mounted on the surface of the substrate.

SUMMARY OF THE INVENTION

Therefore, an object of the present invention is to provide a method of fabricating a ceramic multilayer substrate wherein the surface flatness of the substrate can be improved.

To achieve the object, the present invention provides a method of fabricating a ceramic multilayer substrate comprising steps of laminating a plurality of green sheets including an inside green sheet formed with a conductor pattern and pressing a laminate of green sheets under a predetermined pressure together with sheet restricting members applied to opposite surfaces of the laminate respectively, thereby bonding the laminate and sheet restricting members together, each sheet restricting member having a smaller percent change in thickness than the green sheets during the bonding and a higher firing temperature than the green sheets, firing a bonded assemblage of the green sheets and sheet restricting members at a firing temperature of the green sheets, and removing the sheet restricting members from the opposite surfaces of a fired body.

According to the method, the sheet restricting members sandwiching the laminate of green sheets each have the smaller percent change in thickness than the green sheets during the bonding. Accordingly, the sheet restricting members applied to the respective opposite surfaces of the laminate prevent the substrate surface portions corresponding to the inside layer conductor pattern from being deformed convexly even when the conductor pattern is formed on the inside layer of the substrate. Consequently, the surface flatness of the substrate can be ensured.

The pressure may or may not be applied to the substrate during the firing. The surface flatness of the substrate obtained during pressing can be maintained even when the pressure is not applied to the substrate during the firing. Furthermore, the sheet restricting members restrict the X-Y shrinkage of the substrate during firing.

The bonded laminate of green sheets may be fired while the pressure is being applied to the sheet restricting members to press the green sheets as in the pressing step. Consequently, camber of the substrate and interlayer delamination during firing can be prevented.

The invention provides another method wherein the green sheets are laminated and bonded together under pressure without the sheet restricting members according to an ordinary method of laminating green sheets. The sheet restricting members are then applied to opposite surfaces of the bonded laminate of green sheets respectively. Each sheet restricting member has a smaller percent change in thickness during application of pressure thereto than the green sheets before initiation of shrinkage due to firing, and a higher firing temperature than the green sheets. The bonded laminate of green sheets is fired at a firing temperature of the green sheets together with the sheet restricting members while a pressure is being applied thereto.

If the substrate surface should be deformed convexly by the conductor pattern of the inner layer during the bonding of the green sheets, the bonded laminate of green sheets would be sandwiched between the sheet restricting members and pressed during firing. The convexly deformed portion of the substrate is pressed down such that the surface of the substrate is flattened.

The invention provides further another method comprising steps of laminating a plurality of green sheets including an inside green sheet formed with a conductor pattern and pressing a laminate of green sheets under a predetermined pressure, thereby bonding the laminate together, pressing sheet restricting members while a pressure is being applied to the sheet restricting members, thereby bonding the sheet restricting members to opposite surfaces of the bonded laminate of green sheets, each sheet restricting member having a higher firing temperature than the green sheets, firing a bonded assemblage of green sheets and sheet restricting members at a firing temperature of the green sheets while a pressure is being applied to the assemblage, and removing the sheet restricting members from the opposite surfaces of a fired body. In this method, the pressure applied to the laminate of green sheets is set to be larger than the pressures applied in the subsequent steps (the application of the sheet restricting members and the firing under pressure). That is, the pressures applied during the step of applying the sheet restricting members and the step of firing under pressure are set to be smaller than the pressure applied to the laminate of green sheets during the bonding step.

According to the above-described method, the surfaces of the substrate or the surfaces of the surface layer green sheets are pressed by flat dies of a pressing machine during bonding the green sheets. Accordingly, the surface flatness of the substrate can be maintained when the surface portions of the substrate corresponding to the inside layer conductor pattern is prevented from being convexly deformed by the application of pressures in the subsequent steps. For this purpose, the pressures applied to the sheet restricting members and the bonded assemblage of the green sheets and sheet restricting members respectively are set to be smaller that the pressure applied to the laminate of green sheets.

Each sheet restricting member preferably has a smaller percent change in thickness during the bonding thereof than the green sheets when the pressures applied in the steps are not conditioned as described above. Consequently, the portions of the substrate surfaces corresponding to the inside layer conductor pattern is prevented from the convex deformation such that the surface flatness of the substrate can be ensured.

A relatively low cost alumina green sheet can be used as each sheet restricting member and a high quality low-temperature fired ceramic multilayer substrate can be fabricated when the invention is applied to fabrication of a low-temperature fired ceramic multilayer substrate fired at a temperature ranging between 800 and 1,000° C.

BRIEF DESCRIPTION OF THE DRAWINGS

Other objects, features and advantages of the present invention will become clear upon reviewing the following description of preferred embodiments thereof, made with reference to the accompanying figures, in which.

DETAILED DESCRIPTION OF THE PREFERRED EMBODIMENTS

First Embodiment

Figure 1A:
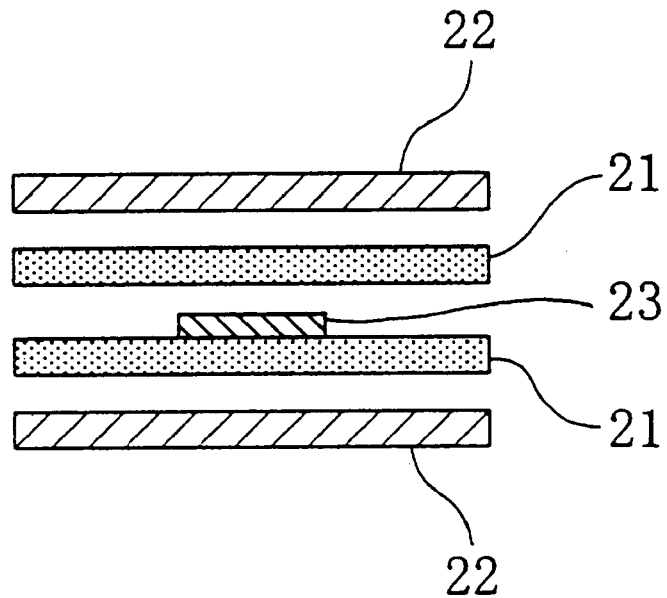
FIGS. 1A and 1B illustrate a fabrication step in each of first and fourth embodiments in accordance with the present invention.

A ceramic multilayer substrate is fabricated in the following steps 1 to 7.

1. Fabrication of green sheet 21:

A mixture of 10 to 55% of CaO by weight, 45 to 70% of $SiO_2$ by weight, 0 to 30% of $Al_2O_3$ by weight and 0 to 10% of impurities by weight, and 5 to 20% of $B_2O_3$ based on the total weight of the former is melted at 1,450° C. to be vitrified. Thereafter, the vitrified mixture is rapidly quenched in water and then pulverized into a $CaO-SiO_2-Al_2O_3-B_2O_3$ glass powder having an average grain diameter of 3 to 3.5 μm. A low-temperature firable ceramic powder is made by mixing 50 to 65% of the glass powder by weight (preferably 60%) and 50 to 35% of alumina powder by weight (preferably 40%) containing 0 to 10% of impurities by weight. A solvent such as toluene or xylene, a binder such as acrylic resin, and a plasticizer such as dioctyl phosphate (DOP) are added to the mixed powder. The mixture is sufficiently blended so that a slurry having a viscosity of 2,000 to 40,000 cps is obtained. The slurry is made by a doctor blade process into a green sheet 21 having a thickness ranging between 0.1 and 0.4 mm.

2. Fabrication of release green sheet 22 (alumina green sheet) serving as a sheet restricting member:

The same solvent, binder and plasticizer as described above are added to an alumina powder containing 100% of $Al_2O_3$ by weight. The mixture is sufficiently blended so that a slurry is obtained. The slurry is made by a doctor blade process into an alumina green sheet having a thickness ranging between 0.1 and 0.4 mm, which alumina green sheet serves as a release green sheet 22. The release green sheet 22 has a smaller percent change in thickness during bonding under pressure as will be described later, than the green sheet 21 and is fired at a temperature ranging between 1550 and 1600° C. The percent change in thickness of the release green sheet 22 during bonding under pressure is adjustable by selecting the type and property of the binder (acrylic resin), varying a quantity of plasticizer mixed or selecting a grain size (green density) of alumina and friability of agglomerate. Generally speaking, the green sheet 21 is softened and the percent change in thickness thereof during bonding under pressure is rendered large as the quantity of plasticizer mixed becomes larger.

3. Punching:

The green sheets 21 are cut by punch dies or a punching machine (neither shown) so as to have predetermined dimensions. Via holes are formed in predetermined locations in the green sheets 21 by means of punching. Furthermore, the release green sheets 22 are cut so as to have the same dimensions as the green sheets 21 or larger dimensions than the latter.

4. Printing conductor pattern:

The via holes of each green sheet 21 are filled with an interlayer via conductor paste composed of Ag, Ag/Pd, Au, Ag/Pt or Cu. A wiring conductor paste having the same composition as the interlayer via conductor paste is screen-printed on the green sheet 21 serving as an inside layer to be formed into a wiring conductor pattern 23.

5. Laminating and bonding under pressure:

A plurality of green sheets 21 are laminated to one upon another with two release green sheets 22 sandwiching them, as shown in FIG. 1. The laminate is heated at a temperature ranging between 80 to 150° C. and then pressed at a pressure ranging between 50 to 250 $kg/cm^2$ to be thereby bonded into an integral body. Each of the release green sheets 22 sandwiching the laminate of green sheets 21 has a smaller percent change in thickness during bonding under pressure than each green sheet 21. Accordingly, portions of the substrate surfaces corresponding to the inside layer conductor pattern 23 is prevented from being convexly deformed by the release green sheets 22 placed on opposite surfaces of the substrate even when the conductor pattern 23 is formed on the inside layer of the substrate, whereupon the surface flatness of the substrate can be ensured. Although two green sheets 21 are laminated in the embodiment shown in FIG. 1, three or more green sheets 21 may be used.

6. Firing:

The integral body of the green sheets 21 and release green sheets 22 bonded together as described above is fired at a firing temperature of green sheet 21 ranging between 800 and 1,000° C. (preferably, 900° C.) with a general electric continuous belt-driven furnace to be thereby formed into a ceramic multilayer substrate. The integral body can be fired in an oxidizing atmosphere (air) when any one of Ag, Ag/Pd, Au and Ag/Pt has been used as the inside layer conductor pattern 23, whereas it needs to be fired in a reducing atmosphere for inhibition of oxidation when Cu has been used as the inside layer conductor pattern 23. In this regard, the release green sheets 22 (alumina green sheets) are fired at 1,550 to 1,600° C. Accordingly, the release green sheets 22 remain unfired when the integral body is fired at 800 to 1,000° C. The solvent and/or the binder in the release green sheets 22 are scattered in the firing process, remaining as an alumina powder.

Pressure is not applied to the substrate during the firing process. However, the surface flatness of the substrate obtained in the bonding process can be maintained. Furthermore, the planar or X-Y shrinkage of the substrate due to firing is restricted by the release green sheets 22 such that accuracy in the substrate dimensions is ensured.

7. Finishing:

The release green sheets 22 or alumina powder adherent to the opposite surfaces of the substrate are removed by means of polishing or the like after the firing. Subsequently, a conductor paste composed of Ag, Ag/Pd, Au, Ag/Pt or Cu is screen-printed on the top and bottom of the substrate to be formed into surface layer conductor patterns, and then, the substrate is fired at 800 to 1,000° C.

Experiments were carried out for the purpose of evaluating the effect of bonding the laminate of green sheets 21 sandwiched by the two release green sheets 22 under pressure.

EXPERIMENT 1

Figure 1B:
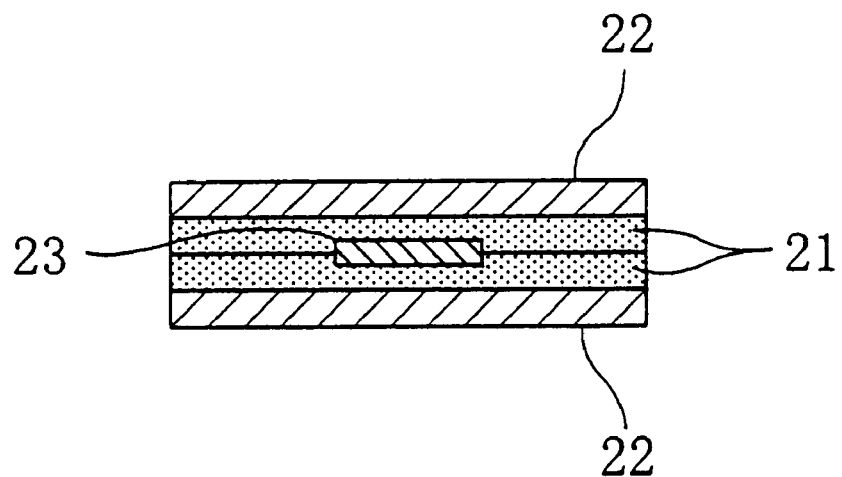
Figure 2:
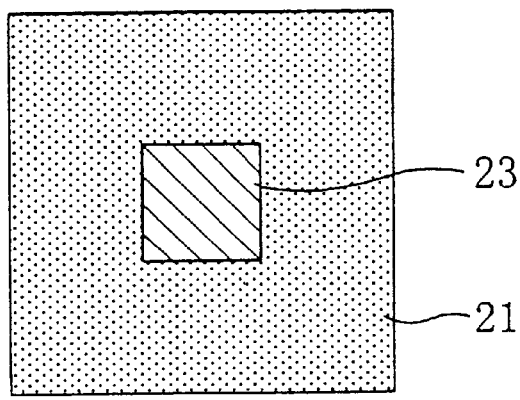
FIG. 2 is a plan view of a sample of green sheet used in experiments.
Figure 3:
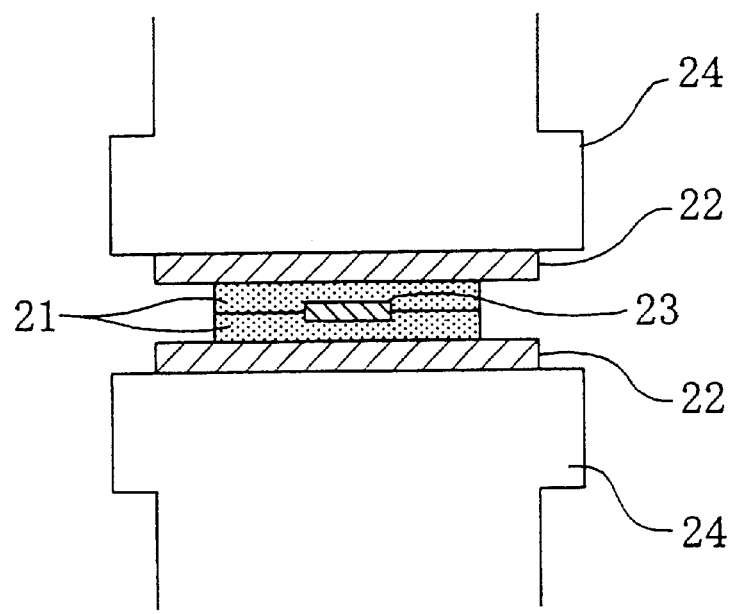
FIG. 3 schematically illustrates the condition of pressure firing in a third embodiment in accordance with the present invention.
Figure 4:
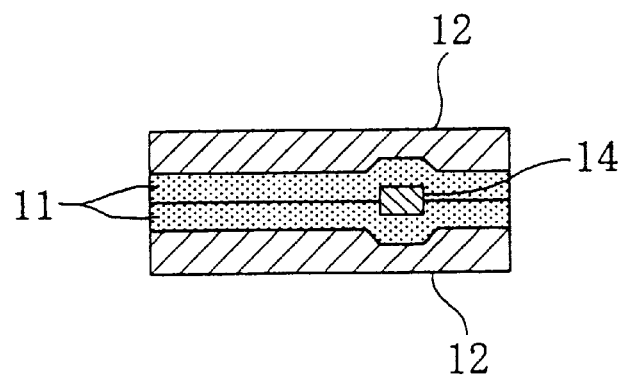
FIG. 4 schematically illustrates a condition where the laminate of green sheets is sandwiched between two release green sheets and then pressed.
Figure 5:
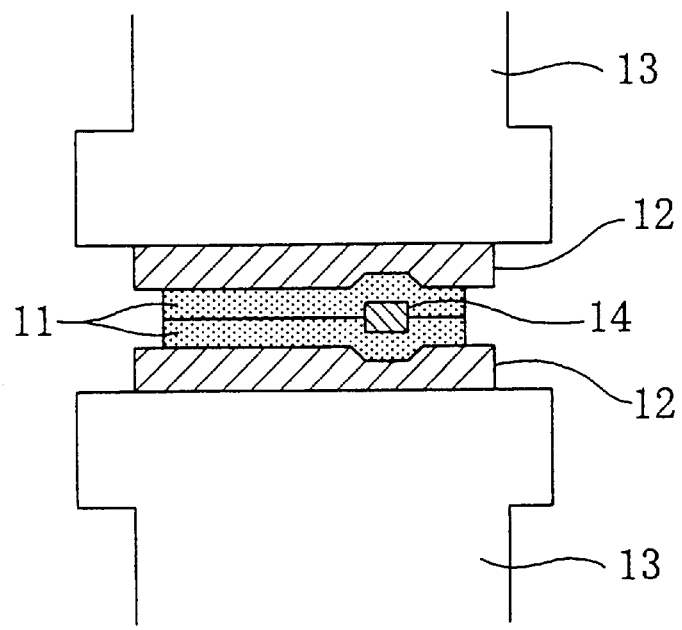
FIG. 5 schematically illustrates a condition where the laminate of green sheets is sandwiched between two release green sheets and then fired while being pressed by a pressing machine 13.

Test samples of green sheet 21 were made from a low-temperature firable ceramic composed of the above-described mixture of 50 to 65% of glass powder of CaO—SiO$_2$—Al$_2$O$_3$—B$_2$O$_3$ system by weight and 50 to 35% of alumina powder by weight. The green sheet 21 was punched out so that a green sheet 30 mm square was obtained. A conductor pattern 10 mm square was printed on the surface of the punched sheet piece, as shown in FIG. 2. The conductor pattern 23 had a thickness of 100 μm. The green sheet 21 without any conductor pattern 23 was placed on the green sheet 21 with the conductor pattern 23 printed thereon, and then, these green sheets 23 were sandwiched by two release green sheets 22, as shown in FIGS. 1A and 1B. Alumina green sheets each composed of 100% of Al$_2$O$_3$ by weight were used as the release green sheets 22.

TABLE 1 shows the relationship between an applied pressure in bonding the test samples and a percent change in thickness of the green sheet 21.

TABLE 1

Relationship between applied pressure in bonding test sample and percent change in thickness of green sheet 21

| Applied pressure in bonding | Percent change in thickness of green sheet 21 |
|---|---|
| 100 kgf/cm$^2$ | 13% |
| 50 kgf/cm$^2$ | 10% |

The thickness change rate of release green sheet 21 can be obtained by the following equation:

$$R=(Tb-Ta)/Tb\times100(\%) \quad (1)$$

where R is percent change in thickness, Tb is thickness before pressure application, and Ta is thickness after pressure application.

TABLE 2 shows the results of measurements of the percent change in thickness of the release green sheet 22 when the applied pressure was 100 kgf/cm$^2$, substrate surface irregularity before firing, and substrate surface irregularity after firing:

TABLE 2

The case where the test samples were bonded under pressure of 100 kgf/cm$^2$

| Sample No. | Percent change in thickness of release green sheet 22 when applied pressue was 100 kgf/cm$^2$ | Substrate surface irregularity before firing | Substrate surface irregularity after firing |
|---|---|---|---|
| First embodiment | | | |
| 1 | 2% | 0.00 mm | 0.00 mm |
| 2 | 4% | 0.00 mm | 0.00 mm |
| 3 | 7% | 0.00 mm | 0.00 mm |
| Compared examples | | | |
| 4 | 13% | 0.06 mm | 0.06 mm |
| 5 | 15% | 0.06 mm | 0.06 mm |
| 6 | 20% | 0.06 mm | 0.06 mm |

The percent change in thickness of the green sheet 21 was 13% when the applied pressure was 100 kgf/cm$^2$, as shown in TABLE 1. Since the percent change in thickness of the release green sheet 22 was smaller than that (13%) of the green sheet 21 in sample Nos. 1 to 3, no irregularity was found on the substrate surfaces both before and after firing, whereupon the substrate surfaces remained flat. Consequently, the reliability of the conductor patterns printed on the surfaces of the fired substrate and then fired and the reliability in the connection of an IC chip to be mounted on the fired substrate were improved.

In sample Nos. 4 to 6, however, the percent change in thickness of the release green sheet 22 was equal to or above the percent change in thickness (13%) of the green sheet 21. Accordingly, the substrate surfaces or the release green sheets 22 were deformed during bonding such that portions of the substrate corresponding to the conductor pattern 23 were convex. Consequently, the irregularity of about 0.06 mm was formed on the substrate surfaces. Such surface irregularity of the substrate lowers the reliability of the conductor patterns printed on the surfaces of the fired substrate and the reliability in the connection of the IC chip to be mounted on the substrate surface.

TABLE 3 shows the results of measurement of the percent change in thickness of the release green sheet 22 when the applied pressure was 50 kgf/cm$^2$, substrate surface irregularity before firing, and substrate surface irregularity after firing:

TABLE 3

The case where the test samples were bonded under pressure of 50 kgf/cm$^2$

| Sample No. | Percent change in thickness of release green sheet 22 when applied pressue was 50 kgf/cm$^2$ | Substrate surface irregularity before firing | Substrate surface irregularity after firing |
|---|---|---|---|
| First embodiment | | | |
| 7 | 1% | 0.00 mm | 0.00 mm |
| 8 | 3% | 0.00 mm | 0.00 mm |
| 9 | 5% | 0.00 mm | 0.00 mm |

TABLE 3-continued

The case where the test samples were bonded under pressure of 50 kgf/cm²

| Sample No. | Percent change in thickness of release green sheet 22 when applied pressue was 50 kgf/cm² | Substrate surface irregularity before firing | Substrate surface irregularity after firing |
|---|---|---|---|
| Compared example | | | |
| 10 | 10% | 0.05 mm | 0.05 mm |

The percent change in thickness of the green sheet 21 was 10% when the applied pressure was 50 kgf/cm², as shown in TABLE 1. Since the percent change in thickness of the release green sheet 22 was smaller than that (10%) of the green sheet 21 in sample Nos. 7 to 9, no irregularity was found on the substrate surfaces both before and after firing, whereupon the substrate surfaces remained flat. In sample No. 10, however, the percent change in thickness of the release green sheet 22 was equal to that (10%) of the green sheet 21. Accordingly, the substrate surfaces or the release green sheets 22 were deformed during bonding under pressure such that portions of the substrate corresponding to the conductor pattern 23 were convex. Consequently, the irregularity of about 0.05 mm was formed on the substrate surfaces.

EXPERIMENT 2

Test samples of green sheet 21 were made from a low-temperature firable ceramic composed of a mixture of 50 to 65% of glass powder of MgO—SiO$_2$—Al$_2$O$_3$—B$_2$O$_3$ system by weight and 50 to 35% of alumina powder by weight. The glass powder consisted of 10 to 55% of MgO by weight, 45 to 70% of SiO$_2$ by weight, up to 30% Al$_2$O$_3$ by weight and up to 10% impurities by weight, and 5 to 20% of B$_2$O$_3$ based on the total weight of the former. The alumina powder contained up to 10% impurities by weight. The other conditions were the same as those in experiment 1.

TABLE 4 shows the relationship between an applied pressure in bonding the test samples under pressure and a percent change in thickness of the green sheet 21:

TABLE 4

Relationship between applied pressure in bonding test sample and percent change in thickness of green sheet 21

| Applied pressure in bonding | Percent change in thickness of green sheet 21 |
|---|---|
| 100 kgf/cm² | 21% |
| 50 kgf/cm² | 15% |

TABLE 5 shows the results of measurements of the percent change in thickness of the release green sheet 22 when the applied pressure was 100 kgf/cm², substrate surface irregularity before firing, and substrate surface irregularity after firing:

TABLE 5

The case where the test samples were bonded under pressure of 100 kgf/cm²

| Sample No. | Percent change in thickness of release green sheet 22 when applied pressue was 100 kgf/cm² | Substrate surface irregularity before firing | Substrate surface irregularity after firing |
|---|---|---|---|
| First embodiment | | | |
| 11 | 2% | 0.00 mm | 0.00 mm |
| 12 | 7% | 0.00 mm | 0.00 mm |
| 13 | 15% | 0.00 mm | 0.00 mm |
| Compared example | | | |
| 14 | 30% | 0.06 mm | 0.06 mm |

The percent change in thickness of the green sheet 21 was 21% when the applied pressure was 100 kgf/cm², as shown in TABLE 4. Since the percent change in thickness of the release green sheet 22 was smaller than that (21%) of the green sheet 21 in sample Nos. 11 to 13, no irregularity was found on the substrate surfaces both before and after firing, whereupon the substrate surfaces remained flat. In sample No. 14, however, the percent change in thickness of the release green sheet 22 was larger that that (21%) of the green sheet 21. Accordingly, the substrate surfaces or the release green sheets 22 were deformed during bonding under pressure such that portions of the substrate corresponding to the conductor pattern 23 were convex. Consequently, the irregularity of about 0.06 mm was formed on the substrate surfaces.

TABLE 6 shows the results of measurements of the percent change in thickness of the release green sheet 22 when the applied pressure was 50 kgf/cm², substrate surface irregularity before firing, and substrate surface irregularity after firing:

TABLE 6

The case where the test samples were bonded under pressure of 50 kgf/cm²

| Sample No. | Percent change in thickness of release green sheet 22 when applied pressue was 50 kgf/cm² | Substrate surface irregularity before firing | Substrate surface irregularity after firing |
|---|---|---|---|
| First embodiment | | | |
| 15 | 1% | 0.00 mm | 0.00 mm |
| 16 | 5% | 0.00 mm | 0.00 mm |
| 17 | 13% | 0.00 mm | 0.00 mm |
| Compared example | | | |
| 18 | 20% | 0.05 mm | 0.05 mm |

The percent change in thickness of the green sheet 21 was 15% when the applied pressure was 50 kgf/cm², as shown in TABLE 4. Since the percent change in thickness of the release green sheet 22 was smaller than that (15%) of the green sheet 21 in sample Nos. 15 to 17, no irregularity was found on the substrate surfaces before and after firing, whereupon the substrate surfaces remained flat. In sample No. 18, however, the percent change in thickness of the release green sheet 22 was larger that that (15%) of the green sheet 21. Accordingly, the substrate surfaces or the release green sheets 22 were deformed during bonding under pressure such that portions of the substrate corresponding to the conductor pattern 23 were convex. Consequently, the irregularity of about 0.05 mm was formed on the substrate surfaces.

Second Embodiment

Although pressure is not applied to the substrate during firing in the first embodiment, the substrate is fired under pressure in the second embodiment. The applied pressure during firing ranges between 2 and 20 kgf/cm$^2$. The other constitution is the same as that in the first embodiment.

In the second embodiment, too, no irregularity is found on the substrate surfaces before and after firing when the percent change in thickness of the release green sheet 22 is rendered smaller than that of the green sheet 21, whereupon the substrate surfaces remains flat. Furthermore, the pressure firing prevents occurrence of camber in the substrate during firing and interlayer delamination.

Third Embodiment

In a third embodiment, the green sheets 21 are laminated and bonded under pressure without use of the release green sheets 22 according to an ordinary method of laminating green sheets. The release green sheets 22 are applied to opposite surfaces of the bonded laminate of green sheets 21 in the pressure firing process respectively. Each release green sheet 22 has a smaller percent change in thickness during pressure application than a percent change in thickness of each green sheet 21 before initiation of shrinkage due to firing, and a higher firing temperature than the green sheets 21. The bonded laminate of green sheets 21 is fired at a firing temperature of the green sheets 21 together with the release green sheets 22 applied to the opposite surfaces of the laminate while pressure is being applied thereto by the pressing machine 24. The applied pressure during firing ranges between 2 and 20 kgf/cm$^2$. The other constitution is the same as that in the first embodiment.

If the substrate surface should be deformed convexly by the conductor pattern 23 of the inner layer during bonding, the bonded laminate of green sheets 21 would be sandwiched between the release green sheets 22 and pressed during firing. The convexly deformed portion of the substrate is pressed down such that the surface of the substrate is flattened.

Experiment 3 was carried out for the purpose of evaluating the fabrication method of the third embodiment.

EXPERIMENT 3

The test samples of green sheets 21 were made from the low-temperature firable ceramic composed of the mixture of 50 to 65% of glass powder of CaO—SiO$_2$—Al$_2$O$_3$—B$_2$O$_3$ system by weight and 50 to 35% of alumina powder by weight as in experiment 1. The alumina green sheets 21 each composed of 100% of Al$_2$O$_3$ by weight were used as the release green sheets 22.

TABLE 7 shows the relationship between the applied pressure in firing the test samples under pressure and the percent change in thickness of the green sheet 21 before initiation of shrinkage due to firing:

TABLE 7

Relationship between applied pressure in firing test sample and percent change of thickness of green sheet 21

| Applied pressure in firing | Percent change in thickness of green sheet 21 before initiation of shrinkage thereof due to pressure firing |
| --- | --- |
| 10 kgf/cm$^2$ | 2% |
| 20 kgf/cm$^2$ | 4% |

TABLE 8 shows the results of measurements of the percent change in thickness of the release green sheet 22 when the test samples were fired under the pressure of 10 kgf/cm$^2$, and the substrate surface irregularity after the pressure firing:

TABLE 8

The case where the test samples were fired under pressure of 10 kgf/cm$^2$

| Sample No. | Percent change in thickness of release green sheet 22 when applied pressre was 10 kgf/cm$^2$ | Substrate surface irregularity after pressure firing |
| --- | --- | --- |
| Third embodiment | | |
| 19 | 1% | 0.00 mm |
| Compared example | | |
| 20 | 5% | 0.04 mm |

The percent change in thickness of the green sheet 21 was 2% when the applied pressure was 10 kgf/cm$^2$, as shown in TABLE 7. Since the percent change in thickness of the release green sheet 22 was smaller than that (2%) of the green sheet 21 in sample No. 19, irregularities formed on the substrate surfaces during the bonding of the green sheets 21 were modified by the pressure firing such that the substrate surfaces were rendered flat. In sample No. 20, however, the irregularities formed on the substrate surfaces during the bonding of the green sheets 21 were not modified since the percent change in thickness of the release green sheet 22 was larger than that (2%) of the green sheets 21, whereupon the irregularity of about 0.04 mm was formed on the substrate surfaces.

TABLE 9 shows the results of measurements of the percent change in thickness of the release green sheet 22 when the test samples were fired under the pressure of 20 kgf/cm$^2$, and the substrate surface irregularity after the pressure firing:

TABLE 9

The case where the test samples were fired under pressure of 20 kgf/cm$^2$

| Sample No. | Percent change in thickness of release green sheet 22 when applied pressre was 20 kgf/cm$^2$ | Substrate surface irregularity after pressure firing |
| --- | --- | --- |
| Third embodiment | | |
| 21 | 1% | 0.00 mm |

TABLE 9-continued

The case where the test samples were fired under pressure of 20 kgf/cm²

| Sample No. | Percent change in thickness of release green sheet 22 when applied pressre was 20 kgf/cm² | Substrate surface irregularity after pressure firing |
| --- | --- | --- |
| 22 Compared example | 3% | 0.00 mm |
| 23 | 10% | 0.04 mm |

The percent change in thickness of the green sheet 21 was 4% when the applied pressure was 20 kgf/cm², as shown in TABLE 7. Since the percent change in thickness of the release green sheet 22 was smaller than that (4%) of the green sheet 21 in sample Nos. 21 and 22, irregularities formed on the substrate surfaces during the bonding of the green sheets 21 were modified by the pressure firing such that the substrate surfaces were rendered flat. In sample No. 23, however, the irregularities formed on the substrate surfaces during the bonding of the green sheets 21 were not modified since the percent change in thickness of the release green sheet 22 was larger than that (4%) of the green sheets 21, whereupon the irregularity of about 0.04 mm was formed on the substrate surfaces.

Although the release green sheets 22 are used as the sheet restricting members in the third embodiment, fired ceramic plates may be used therefor, instead.

Fourth Embodiment

In a fourth embodiment, the pressure applied to the green sheets 21 during bonding under pressure is set to be larger than the pressures applied during the subsequent steps (the application of the release green sheets 22 and the pressure firing). That is, the pressures applied during the step of applying the release green sheets 22 to opposite surfaces of the bonded laminate of green sheets 21 and the pressure firing step are set to be smaller than the pressure applied to the green sheets 21 during the pressure bonding step.

Referring to FIGS. 1A and 1B, the method of the fourth embodiment will be described. The fabrication of green sheets 21, the fabrication of release green sheets 22 serving as the sheet restricting members, punching and screen printing of conductor patterns are the same as those 1. to 4. in the first embodiment respectively.

5. Bonding green sheets 21 under pressure:

A plurality of green sheets 21 are laminated to one upon another, and the laminate is heated at a temperature ranging between 80 to 150° C. and then pressed at a pressure ranging between 50 to 250 kg/cm² to be thereby bonded into an integral body. In this case, the pressure applied to the green sheets 21 during bonding is set to be larger than the pressures applied during the subsequent steps (the application of the release green sheets 22 and the pressure firing). The surfaces of the substrate or the surfaces of the surface layer green sheets 21 are pressed by flat dies of a pressing machine (not shown) during the bonding step. Accordingly, the surface flatness of the substrate can be maintained. Although two green sheets 21 are laminated in the embodiment shown in FIGS. 1A and 1B, three or more green sheets 21 may be used 6. Bonding release green sheets 22 under pressure:

Two release green sheets 22 each having a higher firing temperature than the green sheets 21 are placed on opposite surfaces of the bonded body of green sheets 21 respectively and then pressed to be bonded into a single assemblage, as shown in FIG. 1B. The pressure applied to the release green sheets 22 is set to be smaller than that applied to the green sheets 21 in the previous step, whereby the portions of the substrate surfaces corresponding to the inside layer conductor pattern 23 is prevented from the convex deformation such that the surface flatness of the substrate is ensured.

7. Firing:

The assemblage of the green sheets 21 and release green sheets 22 bonded together as described above is fired at a firing temperature of green sheet 21 ranging between 800 and 1,000° C. (preferably, 900° C.) with a general electric continuous belt-driven furnace to be thereby formed into a ceramic multilayer substrate. The bonded assemblage can be fired in the oxidizing atmosphere (air) when any one of Ag, Ag/Pd, Au and Ag/Pt has been used as the inside layer conductor pattern 23, whereas it needs to be fired in the reducing atmosphere for inhibition of oxidation when Cu has been used as the inside layer conductor pattern 23. In this regard, a pressure (2 to 20 kgf/cm², for example) smaller than that in the step of bonding the green sheets 21 is applied to the assemblage during the firing step, whereupon the portions of the substrate surfaces corresponding to the inside layer conductor pattern 23 are prevented from the convex deformation such that the surface flatness of the substrate can be ensured and such that camber of the substrate and interlayer delamination during firing can be prevented.

8. Finishing:

The release green sheets 22 or alumina powder adherent to the opposite surfaces of the substrate are removed by means of polishing or the like after the firing. Subsequently, a conductor paste composed of Ag, Ag/Pd, Au, Ag/Pt or Cu is screen-printed on the top and bottom of the substrate to be formed into surface layer conductor patterns, and then, the substrate is fired at 800 to 1,000° C.

Fifth Embodiment

The pressure applied to the green sheets 21 during bonding them is set to be larger than the pressures applied during the subsequent steps in the fourth embodiment so that the surface flatness of the substrate is ensured. In a fifth embodiment, however, each release green sheet 22 is formed to have a smaller percent change in thickness during bonding under pressure than the green sheets 21 instead of the above-described conditioned pressures in the respective steps. The other arrangement is the same as that in the fourth embodiment.

In the fifth embodiment, each release green sheet 22 is formed to have a smaller percent change in thickness during bonding under pressure than the green sheets 21 so that the portions of the substrate surfaces corresponding to the inside layer conductor pattern 23 are prevented from the convex deformation such that the surface flatness of the substrate is ensured. In this case, the substrate surface flatness can be ensured even when the pressure applied to the green sheets 21 during the pressure bonding of the sheets 21 is equal to or smaller than the pressure applied to the release green sheets 22 during the pressure bonding of the sheets 22.

On the other hand, in the fourth embodiment, the pressure applied to the green sheets 21 during the pressure bonding is set to be larger than the pressures applied during the subsequent steps (the application of the release green sheets 22 and the pressure firing), so that the substrate surface flatness can be ensured even when the percent change in thickness of each release green sheet 22 during the pressure bonding is equal to or larger than that of each green sheet 21.

Experiments were carried out for the purpose of evaluating the effects of bonding the release green sheets 22 under pressure and the pressure firing with respect to the fourth and fifth embodiments.

EXPERIMENT 4

Test samples of green sheets 21 were made from a low-temperature firable ceramic composed of the mixture of glass powder of $CaO$—$SiO_2$—$Al_2O_3$—$B_2O_3$ system and alumina powder and were the same as those employed in the above-described experiment 1. Accordingly, the above TABLE 1 also shows the relationship between an applied pressure in bonding the test samples and a percent change in thickness of the green sheet 21 in experiment 4. Alumina green sheets each composed of 100% of $Al_2O_3$ by weight were used as the release green sheets 22.

Sample Nos. 31 to 34 in the following TABLE 10 were fabricated in the method of the fourth embodiment. TABLE 10 shows the results of measurements of the percent change in thickness of the release green sheet 22, substrate surface irregularity both before and after firing when the green sheets 21 were bonded together under pressure of 100 kgf/cm² and thereafter, the two release green sheets 22 were pressed under pressure of 50 kgf/cm² to be thereby bonded to the opposite surfaces of the bonded body of green sheets 21:

TABLE 10

The case where green sheets 21 were bonded under pressure of 100 kgf/cm² and release green sheets 22 were bonded under pressure of 50 kgf/cm²

| Sample No. | Percent change in thickness of release green sheet 22 when applied pressue was 50 kgf/cm² | Substrate surface irregularity before firing | Substrate surface irregularity after firing |
|---|---|---|---|
| Fourth embodiment | | | |
| 31 | 10% | 0.00 mm | 0.00 mm |
| 32 | 13% | 0.00 mm | 0.00 mm |
| 33 | 20% | 0.00 mm | 0.00 mm |
| 34 | 24% | 0.00 mm | 0.00 mm |

The percent change in thickness of the green sheet 21 was 10% when the applied pressure was 50 kgf/cm², as shown in TABLE 1. Since the pressure applied to the green sheets 21 during the bonding step of the sheets 21 was larger than the pressure applied to the release green sheets 22 during the bonding step of the sheets 22, the portions of the substrate surfaces corresponding to the inside layer conductor pattern 23 were prevented from the convex deformation in sample Nos. 31 to 34 even when the percent change in thickness of the release green sheet 22 was equal to or larger than that of the green sheet 21. Consequently, the surfaces of the substrate remained flat in sample Nos. 31 to 34, whereby the reliability of the conductor patterns subsequently printed on the surfaces of the fired substrate and the reliability in the connection of an IC chip to be mounted on the fired substrate were improved.

TABLE 11 shows the results of measurements of the percent change in thickness of the release green sheet 22, substrate surface irregularity both before and after firing when the green sheets 21 were bonded together under pressure of 50 kgf/cm² and thereafter, the two release green sheets 22 were pressed under pressure of 100 kgf/cm² to be thereby bonded to the opposite surfaces of the pressed body of green sheets 21. Sample No. 35 was fabricated in the method of the fifth embodiment, whereas sample Nos. 36 to 38 were compared cases.

TABLE 11

The case where green sheets 21 were bonded under pressure of 50 kgf/cm² and release green sheets 22 were bonded under pressure of 100 kgf/cm²

| Sample No. | Percent change in thickness of release green sheet 22 when applied pressue was 100 kgf/cm² | Substrate surface irregularity before firing | Substrate surface irregularity after firing |
|---|---|---|---|
| Fifth embodiment | | | |
| 35 | 7% | 0.00 mm | 0.00 mm |
| Compared examples | | | |
| 36 | 15% | 0.04 mm | 0.04 mm |
| 37 | 19% | 0.06 mm | 0.06 mm |
| 38 | 24% | 0.06 mm | 0.06 mm |

The percent change in thickness of the green sheet 21 was 13% when the applied pressure was 100 kgf/cm², as shown in TABLE 1. Since the percent change in thickness of the release green sheet 22 was smaller than that (13%) of the green sheet 21, the portions of the substrate surfaces corresponding to the inside layer conductor pattern 23 were prevented from the convex deformation by the release green sheets 22 in sample No. 35 even when the pressure applied to the green sheets 21 during the bonding of the sheets 21 was smaller than the pressure applied to the release green sheets 22 during the bonding step of the sheets 22. Consequently, the surface flatness of the substrate was ensured in sample No. 35.

In sample Nos. 36 to 38, however, the portions of the substrate surfaces (release green sheets 22) corresponding to the inside layer conductor pattern 23 were deformed convexly during the bonding step of the release green sheets 22 since the percent change in thickness of the release green sheets 22 was larger than that (13%) of the green sheet 21. Consequently, the irregularity ranging between 0.04 and 0.06 mm was formed on the substrate surfaces. Such surface irregularity of the substrate resulted in reduction in the reliability of the conductor patterns printed on the surfaces of the fired substrate and the reliability in the connection of the IC chip mounted on the substrate surface.

EXPERIMENT 5

Test samples of green sheet 21 were made from a low-temperature firable ceramic composed of the mixture of glass powder of $MgO$—$SiO_2$—$Al_2O_3$—$B_2O_3$ system and alumina powder and were the same as those employed in experiment 2. Accordingly, the above TABLE 4 also shows the relationship between an applied pressure in bonding the test samples under pressure and a percent change in thickness of the green sheet 21 in experiment 5. Alumina green sheets each composed of 100% of $Al_2O_3$ by weight were used as the release green sheets 22.

Sample Nos. 39 to 42 in the following TABLE 12 were fabricated in the method of the fourth embodiment. TABLE 12 shows the results of measurements of the percent change in thickness of the release green sheet 22, substrate surface irregularity both before and after firing when the green sheets 21 were bonded together under the pressure of 100 kgf/cm² and thereafter, the two release green sheets 22 were bonded to the bonded assemblage of green sheets 21 under the pressure of 50 kgf/cm²:

TABLE 12

The case where green sheets 21 were bonded under pressure of 100 kgf/cm² and release green sheets 22 were bonded under pressure of 50 kgf/cm²

| Sample No. | Percent change in thickness of release green sheet 22 when applied pressue was 50 kgf/cm² | Substrate surface irregularity before firing | Substrate surface irregularity after firing |
|---|---|---|---|
| Fourth embodiment | | | |
| 39 | 10% | 0.00 mm | 0.00 mm |
| 40 | 13% | 0.00 mm | 0.00 mm |
| 41 | 20% | 0.00 mm | 0.00 mm |
| 42 | 24% | 0.00 mm | 0.00 mm |

The percent change in thickness of the green sheet 21 was 15% when the applied pressure was 50 kgf/cm², as shown in TABLE 4. Since the pressure applied to the green sheets 21 during bonding the sheets 21 was larger than the pressure applied to the release green sheets 22 during the bonding step of the sheets 22, the portions of the substrate surfaces corresponding to the inside layer conductor pattern 23 were prevented from the convex deformation in sample Nos. 39 to 42 even when the percent change in thickness of the release green sheet 22 was equal to or larger than that of the green sheet 21. Consequently, the surfaces of the substrate remained flat in sample Nos. 39 to 42, whereby the surface flatness of the substrate was ensured in sample Nos. 39 to 42.

TABLE 13 shows the results of measurements of the percent change in thickness of the release green sheet 22, substrate surface irregularity both before and after firing when the green sheets 21 were bonded together under a pressure of 50 kgf/cm² and thereafter, the two release green sheets 22 were bonded to the bonded assemblage of green sheets 21 under a pressure of 100 kgf/cm². Sample Nos. 43 and 44 were fabricated in the method of the fifth embodiment, whereas sample Nos. 45 and 46 were compared cases.

TABLE 13

The case where green sheets 21 were bonded under pressure of 50 kgf/cm² and release green sheets 22 were bonded under pressure of 100 kgf/cm²

| Sample No. | Percent change in thickness of release green sheet 22 when applied pressue was 100 kgf/cm² | Substrate surface irregularity before firing | Substrate surface irregularity after firing |
|---|---|---|---|
| Fifth embodiment | | | |
| 43 | 15% | 0.00 mm | 0.00 mm |
| 44 | 19% | 0.00 mm | 0.00 mm |
| Compared examples | | | |
| 45 | 24% | 0.06 mm | 0.06 mm |
| 46 | 30% | 0.06 mm | 0.06 mm |

The percent change in thickness of the green sheet 21 was 21% when the applied pressure was 100 kgf/cm², as shown in TABLE 4. Since the percent change in thickness of the release green sheet 22 was smaller than that (21%) of the green sheet 21, the portions of the substrate surfaces corresponding to the inside layer conductor pattern 23 were prevented from the convex deformation by the release green sheets 22 in sample Nos. 43 and 44 even when the pressure applied to the green sheets 21 during bonding the sheets 21 was smaller than the pressure applied to the release green sheets 22 during the bonding step of the sheets 22. Consequently, the surface flatness of the substrate was ensured in sample Nos. 43 and 44.

In sample Nos. 45 and 46, however, the portions of the substrate surfaces (release green sheets 22) corresponding to the inside layer conductor pattern 23 were deformed convexly during bonding the release green sheets 22 since the percent change in thickness of the release green sheet 22 was larger than that (21%) of the green sheet 21. Consequently, the irregularity of about 0.06 mm was formed on the substrate surfaces.

The mixture of the glass powder of $CaO$—$SiO_2$—$Al_2O_3$—$B_2O_3$ system or $MgO$—$SiO_2$—$Al_2O_3$—$B_2O_3$ system and the powder of $Al_2O_3$ is used as the material for the green sheets 21 in the foregoing embodiments. A mixture of a glass powder of $SiO_2$—$B_2O_3$ system and a powder of $Al_2O_3$ or a mixture of a glass powder of $PbO$—$SiO_2$—$B_2O_3$ system and a powder of $Al_2O_3$ may be used as the material for the green sheets 21, instead. Furthermore, a ceramic material firable at the temperature of 800 to 1,000° C., such as a crystallized glass of cordierite system may also be used as the material for the green sheets 21.

Furthermore, the green sheet may be made from a dielectric ceramic such as a compound of lead and perovskite, $SrTiO_3$ system, $BaTiO_3$ system or $CaTiO_3$ system. This green sheet may be laminated as an inside layer of the substrate and a capacitor may be embedded in the inside layer. A resistor made from a paste of $RuO_2$ may be embedded in the inside layer of the substrate.

Although the method of the present invention is applied to fabrication of the low-temperature fired ceramic multilayer substrate in the foregoing embodiments, it may be applied to fabrication of ceramic multilayer substrates of alumina and aluminum nitride.

The foregoing description and figures are merely illustrative of the principles of the present invention and are not to be construed in a limiting sense. Various changes and modifications will become apparent to those of ordinary skill in the art. All such changes and modifications are seen to fall within the true spirit and scope of the invention as defined by the appended claims.

We claim:

1. A method of fabricating a ceramic multilayer substrate comprising:

laminating a plurality of green sheets including an inside green sheet formed with a conductor pattern;

forming release green sheets on opposite surfaces of a laminate of green sheets by selecting a binder type, binder property, plasticizer quantity or release green sheet grain size such that a percent change in thickness A of a release green sheet and a percent change in thickness B of a green sheet are $A \leq B-6$ during a subsequent pressing step;

and pressing the laminate of green sheets under a predetermined pressure together with the release green sheets, thereby bonding the laminate and release green sheets together, each release green sheet having a smaller percent change in thickness than the green sheets during the bonding and a higher firing temperature than the green sheets;

firing a bonded assemblage of the green sheets and release green sheets at a firing temperature of the green sheets; and removing the release green sheets from the opposite surfaces of a fired body.

2. The method according to claim 1, wherein a pressure is applied to the release green sheets during the firing step to thereby press the bonded green sheets.

3. The method according to claim 1, wherein each green sheet is formed of a low-temperature firable ceramic having a firing temperature ranging between 800 and 1,000° C.

4. The method according to claim 1, wherein the release green sheets contain a plasticizer.

5. A method of fabricating a ceramic multilayer substrate comprising:

laminating a plurality of green sheets including an inside green sheet formed with a conductor pattern and pressing a laminate of green sheets under a predetermined pressure, thereby bonding the laminate together;

forming release green sheets on opposite surfaces of the bonded laminate of green sheets by selecting a binder type, binder property, plasticizer quantity or release green sheet grain size such that a percent change in thickness A of a release green sheet and a percent change in thickness B of a green sheet are $A \leqq B-1$ during a subsequent pressure application step;

firing the bonded laminate of green sheets at a firing temperature of the green sheets together with the release green sheets while pressure is being applied to the bonded laminate, each release green sheet having a smaller percent change in thickness during application of pressure thereto than the green sheets before initiation of shrinkage due to firing, and a higher firing temperature than the green sheets; and removing the release green sheets from the opposite surfaces of a fired body.

6. The method according to claim 5, wherein each green sheet is formed of a low-temperature firable ceramic having a firing temperature ranging between 800 and 1,000° C.

7. The method according to claim 5, wherein the release green sheets contain a plasticizer.

8. A method of fabricating a ceramic multilayer substrate comprising:

laminating a plurality of green sheets including an inside green sheet formed with a conductor pattern and pressing a laminate of green sheets under a predetermined pressure, thereby bonding the laminate together;

forming release green sheets on opposite surfaces of the laminate of green sheets by selecting a binder type, binder property, plasticizer quantity or release green sheet grain size such that a percent change in thickness A of a release green sheet and a percent change in thickness B of a green sheet are $A \leqq B+14$ during a subsequent pressing step;

pressing release green sheets while a pressure smaller than the pressure applied to the laminate of green sheets during the bonding step is being applied to the release green sheets, thereby bonding the release green sheets to opposite surfaces of the bonded laminate of green sheets, each release green sheet having a higher firing temperature than the green sheets;

firing a bonded assemblage of green sheets and release green sheets at a firing temperature of the green sheets while a pressure smaller than the pressure applied to the laminate of green sheets during the bonding step is being applied to the assemblage; and removing the release green sheets from the opposite surfaces of a fired body.

9. The method according to claim 8, wherein each green sheet is formed of a low-temperature firable ceramic having a firing temperature ranging between 800 and 1,000° C.

10. The method according to claim 8, wherein the release green sheets contain a plasticizer.

11. A method of fabricating a ceramic multilayer substrate comprising:

laminating a plurality of green sheets including an inside green sheet formed with a conductor pattern and pressing a laminate of green sheets under a predetermined pressure, thereby bonding the laminate together;

forming release green sheets on opposite surfaces of the bonded laminate of green sheets by selecting a binder type, binder property, plasticizer quantity or release green sheet grain size such that a percent change in thickness A of a release green sheet and a percent change in thickness B of a green sheet are $A \leqq B-6$ during a subsequent pressing step;

pressing release green sheets, thereby bonding the release green sheets to opposite surfaces of the bonded laminate of green sheets, each release green sheet having a smaller percent change in thickness during bonding and a higher firing temperature than the green sheets;

firing a bonded assemblage of green sheets and release green sheets at a firing temperature of the green sheets while a pressure is being applied to the assemblage; and removing the release green sheets from the opposite surfaces of a fired body.

12. The method according to claim 11, wherein each green sheet is formed of a low-temperature firable ceramic having a firing temperature ranging between 800 and 1,000° C.

13. The method according to claim 11, wherein the release green sheets contain a plasticizer.

* * * * *